United States Patent
Liu et al.

[11] Patent Number: 6,046,108
[45] Date of Patent: Apr. 4, 2000

[54] METHOD FOR SELECTIVE GROWTH OF $CU_3GE$ OR $CU_5SI$ FOR PASSIVATION OF DAMASCENE COPPER STRUCTURES AND DEVICE MANUFACTURED THEREBY

[75] Inventors: Chung-Shi Liu; Chen-Hua Yu; Tien-I Bao; Syun-Ming Jang, all of Hsin-Chu, Taiwan

[73] Assignee: Taiwan Semiconductor Manufacturing Company, Hsin-Chu, Taiwan

[21] Appl. No.: 09/344,402

[22] Filed: Jun. 25, 1999

[51] Int. Cl.[7] .................................................. H01L 21/44
[52] U.S. Cl. ...................... 438/687; 438/626; 438/627; 438/629; 438/633; 438/637; 438/643; 438/648; 438/653; 438/656; 438/669; 438/672; 438/675
[58] Field of Search .................................... 438/687, 637, 438/638, 643, 648, 653, 666, 668, 672, 626, 629, 631, 633, 675, 656, 683, 627, 669

[56] References Cited

U.S. PATENT DOCUMENTS

| | | | |
|---|---|---|---|
| 4,086,176 | 4/1978 | Ericson et al. | 252/100 |
| 5,288,456 | 2/1994 | Aboelfotoh et al. | 420/469 |
| 5,420,069 | 5/1995 | Joshi et al. | 437/187 |
| 5,447,887 | 9/1995 | Filipiak et al. | 438/687 |
| 5,470,789 | 11/1995 | Misawa | 438/687 |
| 5,612,254 | 3/1997 | Mu et al. | 437/195 |
| 5,731,245 | 3/1998 | Joshi et al. | 438/705 |
| 5,744,376 | 4/1998 | Chan et al. | 437/190 |
| 5,789,317 | 8/1998 | Batra et al. | 438/692 |
| 5,818,110 | 10/1998 | Cronin | 257/775 |
| 5,821,168 | 1/2000 | Jain | 438/692 |
| 5,824,599 | 10/1998 | Schacham-Diamand et al. | 438/678 |
| 5,889,328 | 3/1999 | Joshi et al. | 257/751 |
| 5,891,513 | 4/1999 | Dubin et al. | 427/98 |
| 5,933,758 | 8/1999 | Jain | 438/642 |
| 6,004,188 | 12/1999 | Roy | 451/41 |
| 6,010,962 | 1/2000 | Liu et al. | 438/687 |

OTHER PUBLICATIONS

Hymes et al., "Passivation of Copper by Silicide Formation in Dilute Silane," Journal of Applied Physics 71(9), May 1, 1992, pp. 4623–4625.

*Primary Examiner*—John F. Niebling
*Assistant Examiner*—Lynne A. Gurley
*Attorney, Agent, or Firm*—George O. Saile; Stephen B. Ackerman; Graham S. Jones, II

[57] ABSTRACT

Form a dielectric layer on a surface of a conductive substrate with a trench through the top surface down to the substrate. Form a barrier layer over the dielectric layer including the exposed surface of the conductive substrate and the exposed sidewalls of the dielectric layer. Form a copper conductor over the barrier layer and overfilling the narrow hole in the trench. Etch away material from the surface of the copper conductor by a CMP process lowering the copper leaving a thin layer of copper over the barrier layer above the dielectric layer aside from the hole. Form a copper passivation by combining an element selected from silicon and germanium with copper on the exposed surfaces of the copper surfaces forming an interface in the narrower hole between the copper and the copper compound located below the dielectric top level. Etch away material from the surface of the copper compound and the barrier layer to planiarize the copper compound by etching down to the dielectric top level leaving a thin layer of the copper passivation compound covering the copper conductor in the narrower hole.

28 Claims, 3 Drawing Sheets

METHOD FOR SELECTIVE GROWTH OF CU₃GE OR CU₅SI FOR PASSIVATION OF DAMASCENE COPPER STRUCTURES AND DEVICE MANUFACTURED THEREBY

BACKGROUND OF THE INVENTION

1. Field of the Invention

This invention relates to copper electrical conductors formed on a conductive substrate and more particularly to passivation of an exposed surface of such a copper conductor.

2. Description of Related Art

Copper conductors formed as a Damascene structures on the top level of a semiconductor device are directly exposed to air. The formation of an oxide of copper (CuO) on the surfaces of such copper conductors makes it difficult to perform measurements during the Wafer-Accept-and-Test (WAT) process.

U.S. Pat. No. 5,420,069 of Joshi et al. for "Method of Making Corrosion Resistant, Low Resistivity Copper for Interconnect Metal Lines" shows a $Cu_xGe_y$ corrosion resistant layer over a copper (Cu) line. It describes a "corrosion resistant thin film interconnect material, comprising a bilayer formed of a copper (Cu) film over which a layer of $Cu_3Ge$ or copper germanium (Ge) alloy has been deposited." In FIG. 3B, Joshi et al. " . . . shows Cu—Ge passivation layer 180 on all exposed surfaces of copper." This provides "excellent passivation properties". The preferred process described is "selective deposition of germanium over copper surfaces . . . exposing the original Cu layer (or surface) at a low pressure (0.5 Torr to 1 Torr) to a source of germanium, e.g. $GeH_4$ gas, in a chemical vapor deposition (CVD) reactor at temperatures ranging from about 200°–450° C. to convert the outer surface of the Cu lines to $Cu(x)Ge(y)$ or $Cu_3Ge$ . . . . Any Ge containing gas source, e.g. $GeH_4$, $GeH_6$, and the like can be used . . . . It is noted that by increasing the partial pressure of $GeH_4$ more than 0.1 Torr, the $Cu(x)Ge(y)$ alloy can be changed to $Cu_3Ge$ or additional Ge can be formed." Copper "rich phases and . . . specifically $Cu_3Ge$ may also be produced by plating (electrolytic and electroless), sintered powder and sputtered bilayers which are subsequently reacted.

U.S. Pat. No. 4,086,176 of Ericson et al. for "Solutions for Chemically Polishing Surfaces of Copper and Its Alloys" describes an improvement over use of a sulfuric/nitric acid/chlorohydric aqueous solution as an acid bath in a high concentration as a "bright dip." and other baths which were unsatisfactory. Ericson et al. show a solution for chemically polishing copper and copper alloys with mono- and di-substituted alkali metal salts of oxalic acid with a pH value from 3–5 combined with hydrogen peroxide accompanied by a stabilizer comprising a aliphatic fatty amine and benzotriazole and a brightener consisting of sodium lignin sulphonate.

U.S. Pat. No. 5,731,245 of Joshi et al. for "High Aspect Ratio Low Resistivity Lines/Vias with Tungsten Alloy Hard Cap" shows a CuGe CMP hard cap for a copper (Cu) plug. Joshi discusses copper/germanium barrier layers.

S. Hyme et al. "Passivation of copper by silicide formation in dilute silane", Journal of Applied Physics, Vol. 71 pages 4623–4625, (May 1, 1992) discusses use of copper for an interconnection material for integrated circuit devices and reports that copper silicide forms upon exposure of sputtered copper films to two percent silane in nitrogen gas at various temperatures as low as 300° C. It is stated that gamma phase $Cu_5Si$ form first followed by formation of eta phase $Cu_3Si$. Metal silicides decompose when exposed to oxidizing ambients at high temperatures leading to formation of an oxide on the surface which inhibits further decomposition and oxidation, so for copper silicides a $SiO_2$ layer is formed which would retard the oxidation of the underlying silicide and copper at temperatures below 450° C. for use of copper as an interconnection material. The silicide layer reportedly provides protection of the underlying copper from oxidation thereof at temperatures up to 550° C. in air. At page 4625, it is stated that "the gamma phase silicide would be expected to passivate copper interconnection lines from oxygen containing ambients, such as during $SiO_2$ glass insulator deposition."

U.S. Pat. No. 5,288,456 of Aboelfotoh et al. for "Compound with Room Temperature Electrical Resistivity Comparable to that of Elemental Copper" shows a process for producing copper germanide $Cu_3Ge$ compound on the surface of a silicon substrate which had been treated by evacuation to a pressure of $1\times10^{-7}$ Torr for a period of time following which Ge, Ga and copper were deposited sequentially in an evacuated chamber at room temperature to avoid contact with air or oxygen. A thin film of 700 Å of germanium (Ge) was deposited on a <100> surface of the silicon substrate. Then 5–10 atomic percent of gallium (Ga) was deposited on the Ge film followed by deposition of copper (Cu) to a thickness of about 1300 Å. Then the result of the process to this point is annealed at a temperature of about 400° C. in situ for 30 minutes in vacuum. The result is a thin layer of the $Ge_3$ Cu compound with a thickness of about 2000 Å thickness on the surface which has 1–2% of Ga incorporated therein.

U.S. Pat. No. 5,612,254 of Mu et al. for "Methods of Forming Interconnect on a Semiconductor Substrate" describes formation of interconnect channels in a silicon dioxide layer and the forming a titanium nitride barrier followed by filling the channel with a copper conductor followed by plagiarizing the copper and titanium nitride barrier layer to the level of a silicon dioxide layer in which the interconnects are formed. Then the copper surface in the interconnects is covered with a silicon oxynitride passivation layer.

U.S. Pat. No. 5,744,376 of Chan et al. for "Method of Manufacturing Copper Interconnect with Top Barrier Layer" describes damascene process steps for forming copper interconnections with a lower barrier layer composed of titanium nitride, tungsten nitride, titanium tungstide or tantalum nitride and an upper barrier layer of aluminum oxide, tanatalum oxide, or silicon nitride. It is stated at Col. 2, lines 7–11 of Chan et al. that "The term 'damascene' is derived from a form of inlaid metal jewelry first seen in the city of Damascus. In the context of integrated circuits it implies a patterned layer imbedded on and in another layer such that the top surfaces of the two layers are coplanar."

See patents on metal conductor wires as follows:

U.S. Pat. No. 5,818,110 of Cronin for Integrated Circuit Chip Wiring Structure with Crossover Capability and Method of Manufacturing the Same", U.S. Pat. No. 5,824,599 of Schachanm-Diamnand et al. for "Protected Encapsulation of Catalytic Layer for Electroless Copper Interconnect, U.S. Pat. No. 5,889,328, of Joshi et al. for "Refractory Metal Capped Low Resistivity Metal Conductor Lines and Vias", and U.S. Pat. No. 5,891,513 of Dubin et al for "Electroless Cu Deposition on Barrier Layer by Cu Contact Displacement for ULSI Applications".

SUMMARY OF THE INVENTION

For a copper (Cu)-damascene process, we find that a copper (Cu)-CMP planarization process is necessary and that it can require processing in an acid environment including hydrogen peroxide ($H_2O_2$) plus a slurry of a polishing agent.

An object of this invention is to provide Cu conductors which are so manufactured as to avoid Cu corrosion.

Form a copper conductor in a thin film electronic device over a conductive substrate with an ancillary surface in which a dielectric layer is formed on the ancillary surface of the conductive substrate with the dielectric layer having a top surface. Pattern the dielectric layer to etch a trench through the top surface down to the substrate. Expose a portion of the ancillary surface of the conductive substrate and form exposed sidewalls of the dielectric layer. Form a barrier layer over the ancillary surface of the conductive substrate and the dielectric layer including the exposed surface of the conductive substrate and the exposed sidewalls of the dielectric layer. The barrier layer forms a narrower hole in the trench. Form a copper conductor having a surface, with the copper conductor being over the barrier layer with the copper conductor overfilling the narrow hole. Remove material from the surface of the copper conductor leaving a lowered copper surface with a thin layer of copper over the barrier layer above the top surface of the dielectric layer. Grow a copper compound with an element selected from silicon and germanium formed by a reaction with copper in the lowered copper surface with an interface between the copper and the copper compound located below the dielectric top level in the narrower hole in the trench. Subtract material from the surface of the copper compound to lower the top surface for the purpose of planarizing the copper compound to the dielectric top level leaving a thin layer of the compound covering the copper conductor in the narrower hole.

Expose the device in situ to a material selected from silane and germane gas at a high temperature to form the copper germanium film; preferably forming a compound selected from copper silicide compound and copper germanide compound, as a thin film passivation layer.

The device is exposed to in situ to germane $GeH_4$ gas to form the copper germanium film, and the barrier layer comprises a material selected from the group consisting of tantalum, tantalum nitride, titanium nitride, tungsten nitride, tantalum/tantalum nitride, tantalum nitride/talntalunm, and titanium/titanium nitride.

In one aspect, the device is exposed to in situ exposure to germane $GeH_4$ gas in an atmosphere of hydrogen/helium ($H_2$/He) gases at a temperature from about 200° C. to about 400° C. to form a copper germanide ($Cu_3Ge$) compound, as a thin film adhesion layer.

Alternatively, the device is exposed to in situ exposure to silane $SiH_4$ gas in an atmosphere of hydrogen/helium ($H_2$/He) gases at a temperature from about 200° C. to about 420° C. to form a copper silicide (CuSi) compound, as a thin film adhesion layer, and the barrier layer comprises a material selected from the group consisting of tantalum, tantalum nitride, titanium nitride, tungsten nitride, tantalum/tanitalum nitride, tantalum nitride/tantalum, tantalum/tantalum nitride/ tantalum, and titanium/titanium nitride.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

As stated above, Copper Oxide (CuO) formation on an exposed Cu surface makes a Wafer-Accept-and-Test (WAT) measurement difficult; and degrades the device reliability after packaging. Therefore, a passivation layer for such an exposed copper (Cu) surface is necessary. Since copper silicide and copper germanide are inert from oxidation, and have good adhesion to copper in this pattern, in accordance with this invention, a self-aligned copper silicide or copper germanide layer is used to protect the copper surface from oxidation. A copper silicide film or a copper germanide film is formed after trench opening of a dielectric passivation layer. By this method, an exposed copper surface can be fully protected.

Figure 1A:
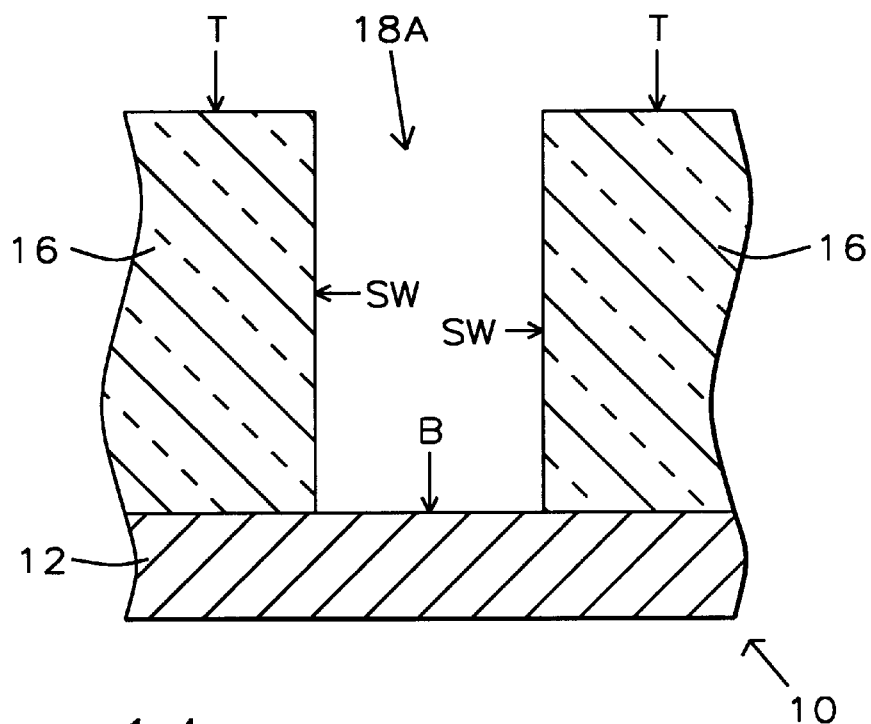
FIGS. 1A–1F show sections of a portion of a semiconductor device in accordance with this invention being manufactured in accordance with this invention.

FIG. 1A shows a sectional view of a portion of a semiconductor device 10 with a substrate 12 formed of an electrically conductive material such as silicide of a refractory metal, e.g. tantalum (Ta) tungsten (W) titanium (Ti) or other such refractory metals, or a metal layer. Above the substrate 12, an InterLevel Dielectric (ILD) or Inter Metal Dielectric (IMD) dielectric layer 16 has been formed and a trench 18A has been formed, preferably by etching with a photolithographic process (i.e. with a photoresist mask which has been stripped away). Trench 18A, that is formed in the top surface of the dielectric layer 16, extends down until it reaches the top surface of the substrate 12 of conductive silicide or metal, possibly removing a modest amount of the surface of substrate 12 during the formation of the trench 18A by a process such as plasma etching, reactive ion etching, wet chemical etching, or otherwise.

Figure 1B:
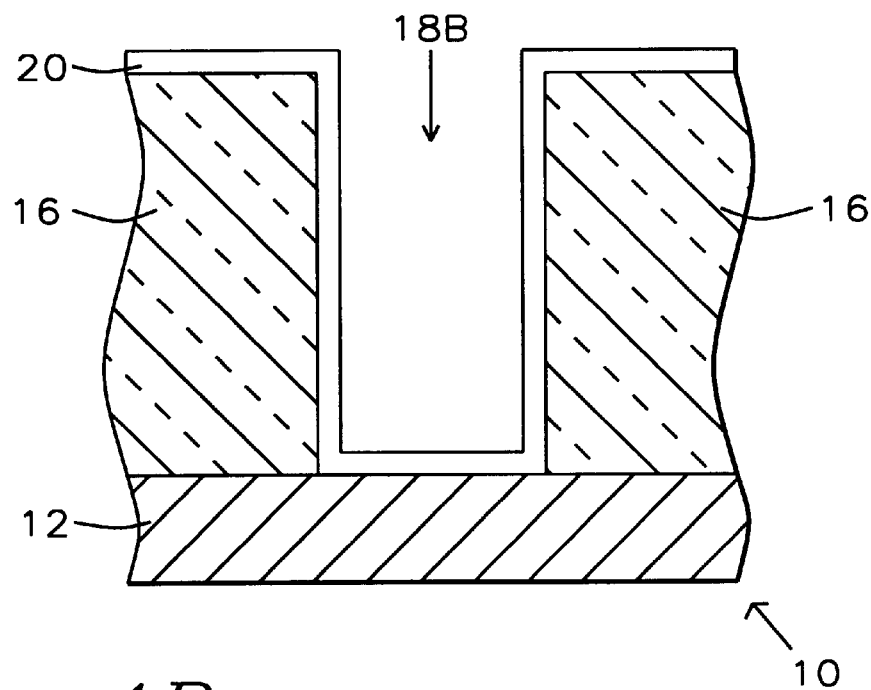

FIG. 1B shows device 10 of FIG. 1A, preferably after precleaning the device by Ar (argon) sputtering or $H_2$/He (hydrogen/helium) gas reactive cleaning followed by formation of a thin barrier barrier layer 20 composed of tantalum (Ta) or tantalum nitride (TaN) superjacent to device 10, i.e. overlying the surfaces of device 10 including the top and sidewalls in trench 18A of dielectric layer 16 and the substrate 12 at the bottom of trench 16A. The addition of barrier layer 20 to the surfaces of device 10 forms (in trench 18A in FIG. 1A) a narrower and shallower trench 18B by covering the top surfaces T of dielectric layer 16 and sidewalls SW of dielectric layer 16. In addition, barrier layer 20 covers the exposed surface of substrate 12 at the bottom B of trench 18A with the barrier layer 20. Barrier layer 20 has a thickness from about 100 Å to about 600 Å and barrier layer 20 is deposited by a process such as PVD or PECVD.

Figure 1C:
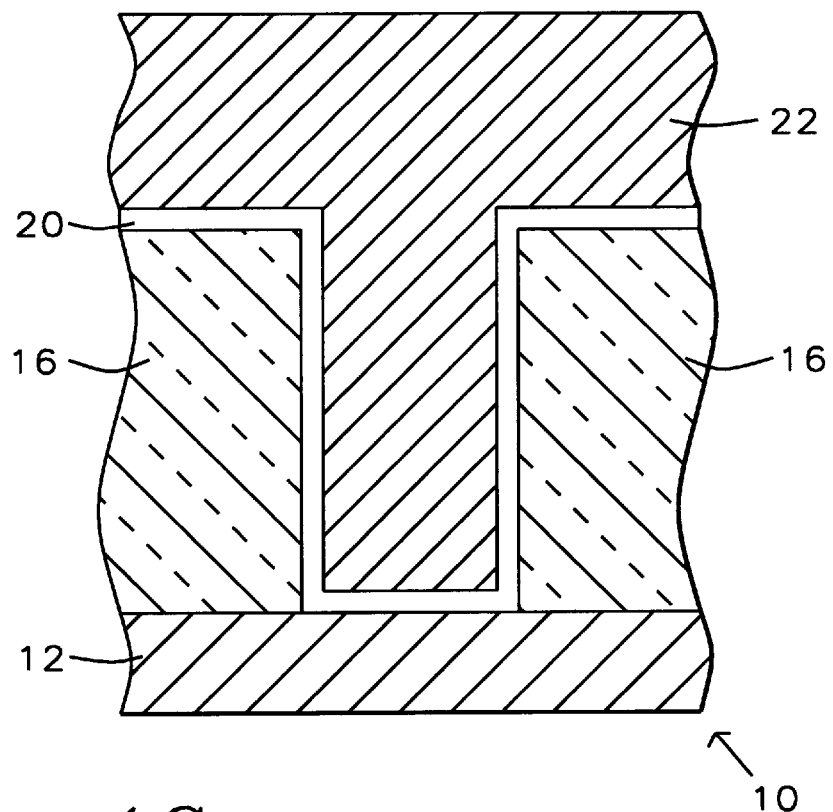

FIG. 1C shows the device 10 of FIG. 1C after trench 18B was overfilled with a copper conductor 22 (e.g. a plug or an interconnect line) by a plating process such as electroless plating or electroplating (after formation of a seed layer). The copper conductor 22 is superjacent to the barrier layer 20 and fills the narrower and shallower trench 18B. The result is that the copper conductor 22 connects electrically to the substrate 12 (metal silicide or metal) through the electrically conductive Ta or TaN barrier layer 20.

The plating process is performed in an environment of copper sulfate ($CuSO_4$) and water ($H_2O$) plus a small amount of sulfuric acid ($H_2SO_4$) and hydrochloric acid (HCl). In an acid solution, the CuO dissolves.

Preliminary Chemical Mechanical Polishing Step

Figure 1D:
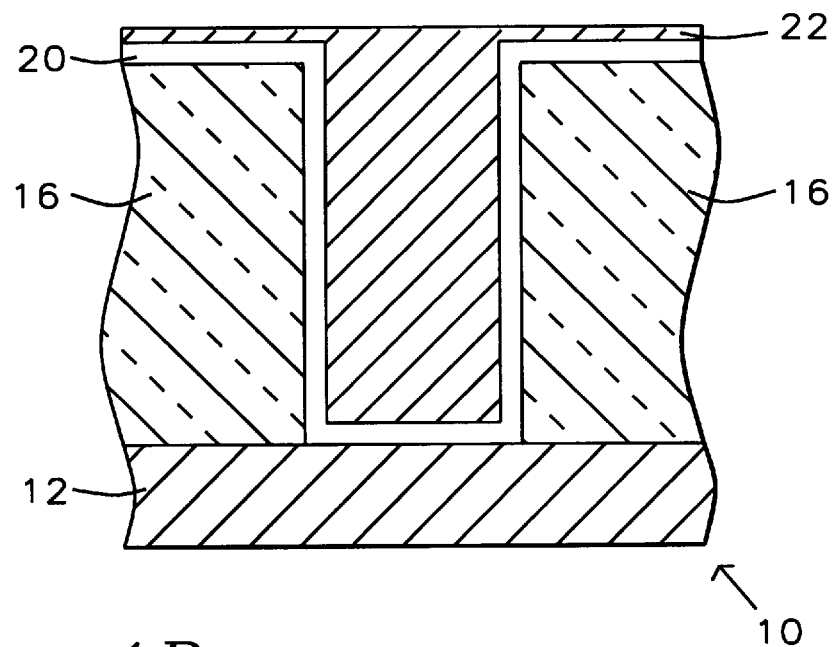

FIG. 1D shows the device 10 of FIG. 1C after a preliminary process step of CMP (Chemical Mechanical Polishing or Planarization) of copper conductor 22 which smooths and thins the surface of copper conductor 22 on the device 10 so that the top surface of the remainder of the copper conductor 22 in the trench 18B is slightly above being coplanar (projecting above barrier layer 20) or nearly coplanar (flush) with the surface of the ILD/IMD layer 16.

The CMP process is performed, preferably using an acid environment with an oxidation agent of hydrogen peroxide ($H_2O_2$), nitric acid, hypochlorous acid, chromic acid, ammonia, ammonium salt, and a slurry of polishing agent such as alumina ($Al_2O_3$) and deionized water (DI $H_2O$) plus BTA (BenzoTriAzole)

The above process of copper (Cu) removal by CMP is stopped before corrosion of any of the copper which is to remain in the trench 20B can occur, since the CMP process involves use of acid treatment, which can lead to corrosion of copper leaving a thin layer of copper conductor 22 above the electrically conductive barrier layer 20.

Figure 1E:
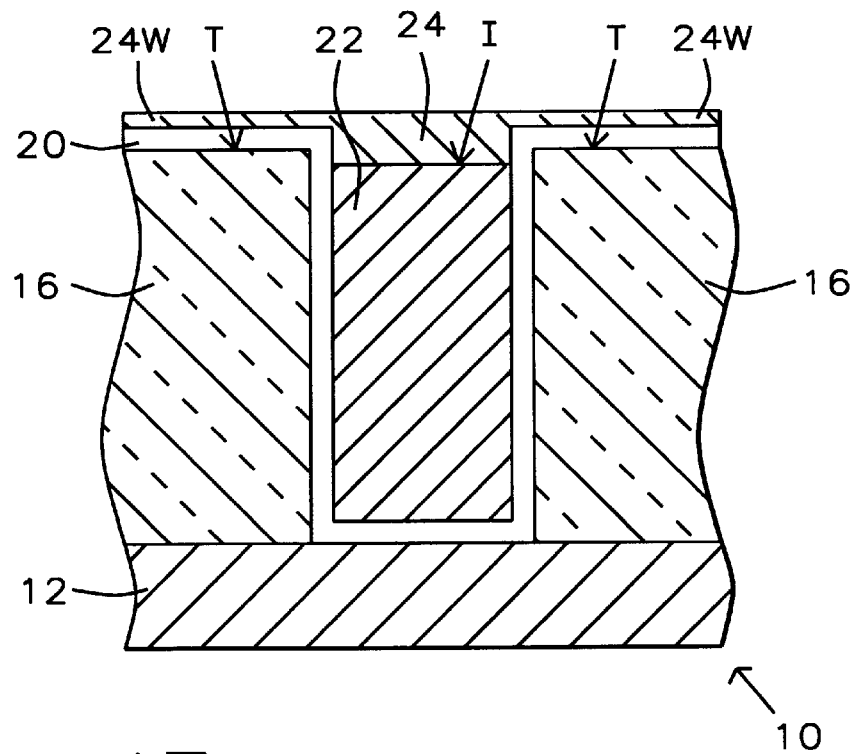

FIG. 1E shows the device 10 of FIG. 1D after selective growth with a copper passivation layer 24 by forming a passivation compound of copper within the exposed surface of copper conductor 22 with an element selected from the group consisting of germanium (Ge) and silicon (Si) to form copper germanide ($Cu_3Ge$) compound and copper silicide ($Cu_5Si$) respectively, since we find that $Cu_3Ge$ and $Cu_5Si$ are good materials for preventing copper oxidation. Note that copper passivation layer 24 extends into the copper conductor 22 reaching a substantial distance below the top surfaces T of the dielectric layer 16.

Formation of Copper Germanide

The selective growth of the copper germailide compound is performed by a Chemical Vapor Reaction (CVR) process which involves introducing into the chamber in situ of a of germane $GeH_4$ gas at a temperature from about 200° C. to about 400° C. to react with copper in conductor 22 forming a copper germanide ($Cu_3Ge$) compound, as thin film passivation layer 24. Growth of the copper germanide compound of passivation layer 24 can be performed following introduction into the chamber containing device 10 of hydrogen/helium ($H_2$/He) gas for reduction of any oxide which exists on the copper substrate 12 juxtaposed with the copper germanide ($Cu_3Ge$) compound, thin film passivation layer 24.

Formation of Copper Silicide

Alternatively selective growth of the copper silicide compound is performed by a Chemical Vapor Reaction (CVR) process which involves introducing into the chamber in situ of a chemical vapor of silane $SiH_4$ gas at a temperature from about 200° C. to about 420° C. to react with copper in conductor 22 forming a copper silicide ($Cu_5Si$) compound, as a thin film passivation layer 24. Growth of the copper silicide ($Cu_5Si$) compound of passivation layer 24 can be performed following introduction into the chamber containing device 10 of hydrogen/helium ($H_2$/He) gas for reduction of any oxide which exists on the copper substrate 12 juxtaposed with the copper silicide ($Cu_5Si$) compound, thin film passivation layer 24 with very thin wings 24W thereof remaining over layer 20.

There are additional ways to form self-aligned copper silicide. One way is using from about 350° C. to about 400° C. thermal SiH4/N2 flow, and no silicon related film can be formed on dielectrics without plasma.

Another way is using silicon (Si) implantation to form self-aligned copper silicide on copper. Then, the implantation step is followed by a wet dip to remove oxide implanted with silicon (Si).

Secondary Chemical Mechanical Polishing Step

Figure 1F:
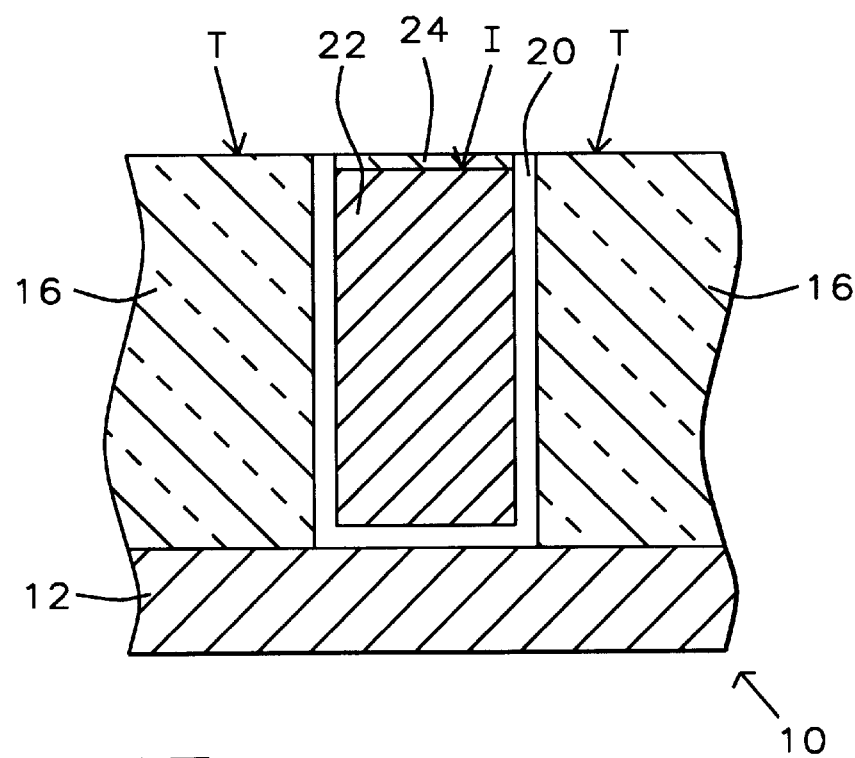

FIG. 1F shows the device 10 of FIG. 1E after the secondary CMP process is performed removing layer 24 including wings 24W, preferably using an acid environment with an oxidation agent of hydrogen peroxide ($H_2O_2$), nitric acid, hypochlorous acid, chromic acid, ammonia, ammonium salt, and a slurry of polishing agent such as alumina ($Al_2O_3$) and deionized water (DI $H_2O$) plus BTA (BenzoTriAzole).

The secondary process of copper (Cu) removal by CMP continues until when the passivation layer 24 is coplanar with the dielectric layer 16 after removal of barrier layer 20 by the CMP process and then the secondary CMP process stops. Thus, since the passivation layer 24 extends down into the trench 18B, below the surface of dielectric layer 16 there is protection of the underlying copper 22 since the CMP process stops before removal of passivation layer 24 in trench 18A, leaving a thin layer of the passivation layer 24 on the surface of copper conductor 22, which protects copper conductor 22 from corrosion. The edges of barrier layer 20 are shown exposed at the top on either end of the copper compound passivation layer 24.

In accordance with a feature of this invention, to form copper silicide, after passivation layer trench opening, treat exposed copper (Cu) in silane/nitrogen ($SiH_4/N_2$) gas ambient mixture in thermal (350° C.) environment.

In accordance with another feature of this invention, use silicon (Si) ion implantation to form Cu silicide.

Another feature of this invention is to perform a wet dip to remove oxide material implanted along with the Si ions.

Advantages are that copper silicide is an electrically conductive material, and can prevent the copper oxide (CuO) formation on copper (Cu).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is as follows:

1. A method of forming a device on a surface of a conductive substrate comprising:

forming a dielectric layer over said surface, said dielectric layer having a top level;

forming a trench with sidewalls through said dielectric layer to expose a portion of said surface;

forming a barrier layer narrowing said trench and covering said surface and covering said top level and said sidewalls of said dielectric layer;

depositing copper as a blanket overfilling said narrow hole and covering said top level;

subtracting material from the surface of said copper leaving a thin layer of said copper covering said barrier layer and said dielectric layer, forming a copper passivation combination with an element selected from silicon and germanium thereby lowering remaining portions of said copper below said dielectric top level in said narrow hole; and planarizing said copper passivation combination to said top level leaving a thin layer of said compound covering said copper conductor in said narrow hole.

2. The method of claim 1, wherein:
said device is exposed to in situ to a material selected from silane ($SiH_4$) and germane ($GeH_4$) gas at a high temperature to form said copper passivation combination as a copper compound.

3. The method of claim 1, wherein:
said device is exposed to in situ to a material selected from silane ($SiH_4$) and gas to form said a copper passivation combination as a compound selected from copper silicide ($Cu_5Si$) compound and copper germanide ($Cu_3Ge$) compound, as a thin film passivation layer.

4. The method of claim 1, wherein:
said device is exposed to in situ to germane $GeH_4$ gas to form said copper passivation combination as a copper germanium film, and
said barrier layer comprises a material selected from the group consisting of tantalum, tantalum nitride, titanium nitride, tungsten nitride, tantalum/tantalum nitride, tantalum nitride/tantalum, tantalum/tantalum nitride/tantalum, and titanium/titanium nitride.

5. The method of claim 1, wherein said device is exposed to in situ exposure to germane $GeH_4$ gas in an atmosphere of hydrogen/helium ($H_2$/He) gases at a temperature from about 200° C. to about 400° C. to form a copper germanide ($Cu_3Ge$) compound, as a thin film adhesion layer, and
said barrier layer comprises a material selected from the group consisting of tantalum, tantalum nitride, titanium nitride, tungsten nitride, tantalum/tantalum nitride, tantalum nitride/tantalum, tantalum/tantalum nitride/tantalum, and titanium/titanium nitride.

6. The method of claim 1, wherein said device is exposed to in situ exposure to germane $GeH_4$ gas in an atmosphere of hydrogen/helium ($H_2$/He) gases at a temperature from about 200° C. to about 420° C. to form a copper silicide ($Cu_5Si$) compound, as a thin film adhesion layer, and
said barrier layer comprises a material selected from the group consisting of tantalum, tantalum nitride, titanium nitride, tungsten nitride, tantalum/tantalum nitride, tantalum nitride/tantalum, tantalum/tantalutm nitride/tantalum, and titanium/titanium nitride.

7. The method of claim 1, wherein said device is exposed to in situ to said silane $SiH_4$ gas mixed with nitrogen ($N_2$) gas at a temperature from about 350° C. to about 400° C. thermal flow to form a copper silicide compound.

8. The method of claim 1, wherein said device is implanted with silicon.

9. The method of claim 1, wherein after said device is implanted with silicon, the step is performed of employing a wet dip to remove oxide.

10. The method of claim 1, wherein said copper is deposited by plating in an environment of copper sulfate ($CuSO_4$) and water ($H_2O$) plus some sulfuric acid ($H_2SO_4$) and hydrochloric acid (HCl).

11. The method of claim 1, wherein said step of subtracting material comprises a Chemical Mechanical Planarization (CMP) process performed, preferably using an acid environment with an oxidation agent of hydrogen peroxide ($H_2O_2$), nitric acid, hypochlorous acid, chromic acid, ammonia, ammonium salt, and a slurry of polishing agent such as alumina ($Al_2O_3$) and deionized water (DI $H_2O$) plus BTA (BenzoTriAzole).

12. The method of claim 1, wherein said step of planarizing comprises a Chemical Mechanical Planarization (CMP) process performed, preferably using an acid environment with an oxidation agent of hydrogen peroxide ($H_2O_2$), nitric acid, hypochlorous acid, chromic acid, ammonia, ammonium salt, and a slurry of polishing agent such as alumina ($Al_2O_3$) and deionized water (DI $H_2O$) plus BTA (BenzoTriAzole).

13. The method of claim 1, wherein said copper is deposited by plating in an environment of copper sulfate ($CuSO_4$) and water ($H_2O$) plus some sulfuric acid ($H_2SO_4$) and hydrochloric acid (HCl),
said steps of subtracting material and planarizing comprise a Chemical Mechanical Planarization (CMP) process performed, preferably using an acid environment with an oxidation agent of hydrogen peroxide ($H_2O_2$), nitric acid, hypochlorous acid, chromic acid, ammonia, ammonium salt, and a slurry of polishing agent such as alumina ($Al_2O_2$) and deionized water (DI $H_2O$) plus BTA (BenzoTriAzole).

14. A method of forming a copper conductor in a thin film electronic device over a conductive substrate with a top surface comprising:
forming a dielectric layer superjacent to said top surface of said conductive substrate, said dielectric layer having a top surface located at a dielectric top level,
patterning said dielectric layer to etch a hole therethrough with a dry plasma to etch a trench down to said conductive substrate exposing a portion of said top surface of said conductive substrate and forming exposed sidewalls of said dielectric layer,
forming a barrier layer composed of a material selected from the group consisting of tantalum and tantalum nitride,
said barrier layer being superjacent to, as follows:
a) said top surface of said conductive substrate,
b) said dielectric layer including said exposed top surface of said conductive substrate and said exposed sidewalls of said dielectric layer,
said barrier layer forming a narrower hole in said trench,
forming a copper conductor having a surface, said copper conductor being superjacent to said barrier layer, said copper conductor overfilling said narrower hole,
removing material from said surface of said copper conductor by a CMP etching process leaving a lowered copper surface with a thin layer of copper over said barrier layer above said top surface of said dielectric layer,
adding silicon or germanium to said copper forming an interface between said copper and said copper/silicon compound or copper/germanium compound located below said dielectric top level in said narrower hole in said trench, and
then subtracting material from the surface of said copper compound by a CMP etching process to planarize said copper compound down to said dielectric top level leaving a thin layer of said compound covering said copper conductor in said narrower hole.

15. The method of claim 14, wherein:
a copper compound is grown with an element selected from silicon and germanium by exposure of said copper conductor to a material selected from silane ($SiH_4$) and germane ($GeH_4$) gas at a high temperature to form said copper germanium film by a reaction with copper in said lowered copper surface, and
said device is exposed to in situ to said germane $GeH_4$ gas to form said copper germanide film.

16. The method of claim 14, wherein:
a film of a copper compound with germanium is grown by exposure of said copper conductor in situ to germane ($GeH_4$) gas at a high temperature from about 200° C. to about 400° C. to form said copper compound with germanium by a reaction with copper in said lowered copper surface to form a copper germanide ($Cu_3Ge$) compound, as a thin film adhesion layer.

17. The method of claim 14, wherein:

a film of a copper compound with germanium is grown by exposure of said copper conductor in situ to germane ($GeH_4$,) gas at a high temperature from about 200° C. to about 400° C. in an atmosphere of hydrogen/helium ($H_2$/He) gases to form said copper compound with germanium by a reaction with copper in said lowered copper surface to form a copper germanide ($Cu_3Ge$) compound, as a thin film adhesion layer.

18. The method of claim 14, wherein:

said device is exposed in situ to silane $SiH_4$ gas to form a film of a copper silicide compound which is grown by exposure of said copper conductor to silane ($SiH_4$) gas at a high temperature to form said copper/silicon film by a reaction with copper in said lowered copper surface.

19. The method of claim 14, wherein:

said copper conductor is exposed in situ to silane $SiH_4$ gas at a temperature from about 200° C. to about 420° C. to form a film of a copper silicide ($Cu_5Si$) compound by a reaction with copper in said lowered copper surface, as a thin film adhesion layer.

20. The method of claim 14, wherein:

a copper compound is grown with an element selected from silicon and germanium by exposure of said copper conductor to silane ($SiH_4$) gas at a high temperature to form said copper germanium film by a reaction with copper in said lowered copper surface, said copper conductor being exposed in situ to said silane $SiH_4$ gas at a temperature from about 200° C. to about 420° C., in an atmosphere of hydrogen/helium ($H_2$/He) gases to form a copper silicide ($Cu_5Si$) compound, as a thin film adhesion layer.

21. The method of claim 14, wherein:

a copper compound is grown with elemental silicon by exposure of said copper conductor to silane ($SiH_4$) germane ($GeH_4$) gas at a high temperature to form a copper silicide film by a reaction with copper in said lowered copper surface, said copper being exposed in situ to said silane $SiH_4$ gas mixed with nitrogen ($N_2$) gas at a temperature from about 350° C. to about 400° C. thermal flow to form a copper silicide compound.

22. The method of claim 14, wherein said device is implanted with silicon.

23. The method of claim 14, wherein after said device is implanted with silicon, the step is performed of employing a wet dip to remove oxide.

24. The method of claim 14, wherein said copper conductor is deposited by plating in an environment of copper sulfate ($CuSO_4$) and water ($H_2O$) plus some sulfuric acid ($H_2SO_4$) and hydrochloric acid (HCl).

25. The method of claim 14, wherein said step of subtracting material comprises a Chemical Mechanical Planarization (CMP) process performed, preferably using an acid environment with an oxidation agent of hydrogen peroxide ($H_2O_2$), nitric acid, hypochlorous acid, chromic acid, ammonia, ammonium salt, and a slurry of polishing agent such as alumina ($Al_2O_3$) and deionized water (DI $H_2O$) plus BTA (BenzoTriAzole).

26. The method of claim 14, wherein said copper is deposited by plating in an environment of copper sulfate ($CuSO_4$) and water ($H_2O$) plus some sulfuric acid ($H_2SO_4$) and hydrochloric acid (HCl).

27. The method of claim 14, wherein said step of planarizing comprises a Chemical Mechanical Planarization (CMP) process performed, preferably using an acid environment with an oxidation agent of hydrogen peroxide, nitric acid, hypochlorous acid, chromic acid, ammonia, ammonium salt, and a slurry of polishing agent such as alumina and deionized water pus BenzoTriAzole.

28. The method of claim 26, wherein after said device is implanted with silicon, the step is performed of employing a wet dip to remove oxide.

* * * * *